United States Patent [19]

Bregman et al.

[11] Patent Number: 5,233,221

[45] Date of Patent: * Aug. 3, 1993

[54] ELECTRONIC SUBSTRATE MULTIPLE LOCATION CONDUCTOR ATTACHMENT TECHNOLOGY

[75] Inventors: Mark F. Bregman, Ridgefield, Conn.; Raymond R. Horton, Dover Plains, N.Y.; Alphonso P. Lanzetta, Marlboro, N.Y.; Ismail C. Noyan, Peekskill, N.Y.; Michael J. Palmer, Walden, N.Y.; Ho-Ming Tong, Yorktown Heights, N.Y.

[73] Assignee: International Business Machines Corporation, Armonk, N.Y.

[*] Notice: The portion of the term of this patent subsequent to May 26, 2009 has been disclaimed.

[21] Appl. No.: 736,090

[22] Filed: Jul. 26, 1991

Related U.S. Application Data

[63] Continuation of Ser. No. 602,837, Oct. 24, 1990, Pat. No. 5,117,275.

[51] Int. Cl.$^5$ .................. H01L 23/48; H01L 29/44; H01L 29/52; H01L 29/60
[52] U.S. Cl. .................. 257/674; 257/668; 257/673; 257/735; 257/738; 257/773; 257/786
[58] Field of Search ............ 357/70, 68, 65, 70, 357/68; 257/668, 673, 674, 735, 738, 773, 786

[56] References Cited

U.S. PATENT DOCUMENTS

| | | | |
|---|---|---|---|
| 4,145,707 | 3/1979 | Sadamasa et al. | 357/65 |
| 4,166,312 | 9/1979 | Harigane et al. | 29/38 C |
| 4,223,337 | 9/1980 | Kojima et al. | 357/65 |
| 4,306,246 | 12/1981 | Davies et al. | 357/65 |
| 4,361,173 | 11/1982 | Storimans | 140/1 |
| 4,435,740 | 3/1984 | Huckabee et al. | 361/398 |
| 4,538,210 | 8/1985 | Schaller | 361/401 |
| 4,573,501 | 3/1986 | Furuya | 140/147 |
| 4,814,855 | 3/1989 | Hodgson et al. | 174/52.4 |
| 4,887,760 | 12/1989 | Yoshino et al. | 228/56.3 |
| 4,912,547 | 3/1990 | Bilowith et al. | 357/80 |
| 4,949,158 | 8/1990 | Ueda | 357/68 |
| 4,972,253 | 11/1990 | Palino et al. | 357/74 |
| 4,996,582 | 2/1991 | Nagahama | 357/69 |
| 5,016,080 | 5/1991 | Giannella | 357/45 |
| 5,023,700 | 6/1991 | Takeuchi et al. | 357/65 |
| 5,028,983 | 7/1991 | Bickford et al. | 357/69 |
| 5,034,792 | 7/1991 | Kimura et al. | 357/65 |
| 5,070,387 | 12/1991 | Van Gorkum | 357/23.2 |

FOREIGN PATENT DOCUMENTS

| | | |
|---|---|---|
| 54-17666 | 2/1979 | Japan . |
| 54-124677 | 9/1979 | Japan . |
| 55-12791 | 1/1980 | Japan . |
| 56-51851 | 5/1981 | Japan . |
| 58-042247 | 3/1983 | Japan . |
| 58-68959 | 4/1983 | Japan . |
| 59-25238 | 2/1984 | Japan . |
| 59-107551 | 6/1984 | Japan . |
| 60-249354 | 12/1985 | Japan . |
| 62-188333 | 8/1987 | Japan . |
| 01-174108 | 7/1989 | Japan . |
| 01-177707 | 7/1989 | Japan . |
| 2-33959 | 2/1990 | Japan . |

OTHER PUBLICATIONS

Microelectronics Packaging Handbook edited by Rao R. Tummala and Eugene J. Rymaszewski, published by Van Nostrand, (1989), pp. 409–431.

IBM Technical Disclosure Bulletin vol. 32, No. 11, Apr. 1990, pp. 246 and 247 "Quadtab: A Technique for the Simplification and Enhancement of Tab" by Honeycutt et al.

IBM Technical Disclosure Bulletin vol. 14, No. 8, Jan. 1972, p. 2435 "Connection of Discrete Leads to Packaged Circuits" by W. E. Dougherty.

*Primary Examiner*—Andrew J. James
*Assistant Examiner*—Ngan Van Ngo
*Attorney, Agent, or Firm*—Daniel P. Morris; Alvin J. Riddles

[57] ABSTRACT

A conductor attachment wherein each conductor is mounted on a dielectric tape and has an attachment portion that is supported by the tape to an adjacent location a uniform distance from the bonding location and that contacts on a level with the plane of the underside of the tape. One conductor supporting tape has portions of the tape that extend into a central contacting area opening to contact locations at contacting pads in rows remote from the edge. Another supporting tape has window openings at the contacting locations. The conductor ends are brought into the level of the underside of the tape by a manufacturing rolling operation between an elastomer surface roller and a solid backing roller.

17 Claims, 4 Drawing Sheets

ELECTRONIC SUBSTRATE MULTIPLE LOCATION CONDUCTOR ATTACHMENT TECHNOLOGY

This application is a continuation of application Ser. No. 07/602,837 filed Oct. 24, 1990, now U.S. Pat. No. 5,117,275.

The terminal portion of the patent issuing on this application that is beyond the expiration of U.S. Pat. No. 5,117,275 issuing on application Ser. No. 07/602,837 filed Oct. 24, 1990 is disclaimed.

FIELD OF THE INVENTION

The invention is in the field of electronic and semiconductor device packaging wherein circuit connections are made between closely spaced contacting locations and external circuitry.

BACKGROUND OF THE INVENTION AND RELATION TO PRIOR ART

Electronic apparatus involving such items as semiconductor devices have circuit density to the level that the contacting locations, such as the pads on the surface of a semiconductor chip which provide the interface with external circuitry, now must be in more than one row and may be at random locations in a larger attachment area. This in turn results in a large quantity of very small and closely positioned contacting locations that require interconnection to outside or external circuitry and which are not uniformly located with respect to an edge of the attachment area. The sizes involved and volume of production are such that normal manual dexterity can no longer be employed. The structural shapes, the materials, the processes and the conditions of processing must be compatible both to make the fabrication possible within the design constraints and to provide reliability over the life of the device and circuitry package.

In semiconductor technology, the connection between the pad or contact area on the semiconductor chip and the external circuitry is made using an array of conductors on an insulating backing member with very closely spaced inner lead cantilevered members extending into a semiconductor chip accommodating opening with the inner lead member being bonded to the pad or contact area on the chip and the array expanding outwardly to a more easily connectable spacing. This type of conductor array has become known in the art as the lead frame.

In some electronic wiring, the conductors are mounted on flexible insulating backing with solder reflow and thermocompression bonding type connections to pads or connecting locations on electronic devices being made at locations along the edges of the devices.

Generally, in the art, the contacting area has been confined to a small region in the vicinity of the edge of the device or circuitry being contacted.

As the art has continued to progress, a variation of the lead frame technology has evolved in which a conductor pattern, such as an array of leads, is placed on a dielectric tape filament. One version of this technology is known as flexible tape wiring or FLEX tape. Another version for high precision device contacting is known as Tape Automated Bonding (TAB). It facilitates many registration aspects in automated semiconductor packaging. In the TAB technology, the conductive connecting members extend as beam leads cantilevered into an opening for the semiconductor chip in the tape filament. The TAB technology is described in the "Microelectronics Packaging Handbook" edited by R. R. Tummala and E. J. Rymazewski, published by Van Nostrand, (1989), pages 409-431.

The specifications in the art have now reached the range where multiple rows of pads are being used on the chip to relax spacing constraints as illustrated in Japanese patent 55-12791 and widening the ends of the connecting leads is used in relaxing registration problems as illustrated in Japanese patent 54-124677.

In electronic packaging where lead size and spacing is 5 mils or less on 10 mils or less separation, it is becoming increasingly difficult to achieve high yields of reliable bonded contacts to the packages.

SUMMARY OF THE INVENTION

The invention provides a dielectric tape close spacing contact technology wherein the conductors which are on the upper side of the dielectric tape are all supported by the dielectric tape adjacent to and at a uniform distance from the end or attachment portion of the conductor and all the attachment portions are at the same level as the underside of the dielectric tape. The dielectric tape in one positioning embodiment is provided with a central contacting opening having edges with extensions supporting conductors that are bonded to pads in rows farther from the edges. The dielectric tape in another positioning embodiment is provided with window openings that coincide with the contacting locations in the contacting area, an arrangement that permits close spacing and conductors over the face of a chip. A manufacturing principle is provided for uniform bonding with the dielectric tape and all contacting members resting on the chip surface.

DESCRIPTION OF THE INVENTION

In the invention, conductors having contacting portions that end in alternate rows are each supported by dielectric tape to a location adjacent to the contact location or the location where the connecting bond is to be made and at least a portion of the contacting end of the conductor is at the plane of the underside of the dielectric tape. The contacting portions of the invention are useable with dielectric tape configurations where the contacts are made in one embodiment adjacent to edges of the dielectric that in turn have portions extending to the rows of bonding locations and in another embodiment the dielectric tape has staggered location openings or windows through the dielectric coinciding with the contacting locations.

Figure 1:
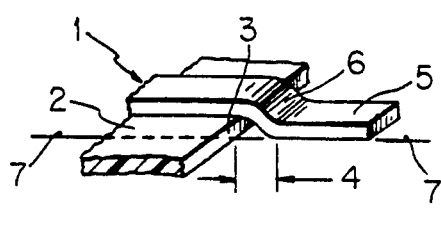
FIG. 1 is a schematic view of one embodiment of the attachment portion of a dielectric supported automated bondable conductor.
Figure 2:
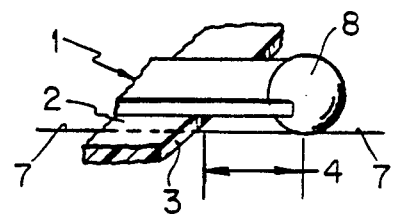
FIG. 2 is a schematic view of another embodiment of the attachment portion of a dielectric supported automated bondable conductor.

Referring to FIGS. 1 and 2, alternate embodiments of the contacting or bonding portion of the dielectric supported conductor end of the invention are shown. In FIG. 1, a schematic view is provided of the conductor 1 supported by the dielectric 2 to a location 3 that is a uniform distance 4 from the conductor end 5 that is to be bonded to other circuitry or the connecting location of a device. The end 5 of the conductor is formed by bending at location 6 so that the undersurface thereof is in the same plane as the undersurface of the dielectric 2 as indicated by the line 7. In the schematic view of FIG. 2, the conductor 1 extends to a ball shaped contacting end 8, a portion of the surface of which is at the plane of the underside of the dielectric 2 as represented by the line 7. The uniform distance 4 is from the location 3 where the support of the dielectric 2 ends to the bond location where the ball contact extends to line 7. The ball 8 type contacting technology is well developed in the art with the ball 8 being tailorable both as to precise dimension and to particular process conditions in bonding. An example of this technology may be found in U.S. Pat. No. 5,006,917.

In accordance with the invention, the conductor attachment portion structure as shown in FIGS. 1 and 2 provides improvements in ability to register with device and conductor contact locations as dimensions become smaller and in ability to get high yields of electrically acceptable and reliable bonds in process windows that are becoming ever narrower. The process window is the temperature excursion and duration that is tolerable for the particular operation involved. Where the conductor attachment or bond locations are device pads in high density semiconductor integrated circuits, very narrow process windows are involved.

When the conductor attachment end structures of the invention are employed, all contacts and the dielectric are at the same level so that in the bonding operation all of the process window may be employed.

Figure 3:
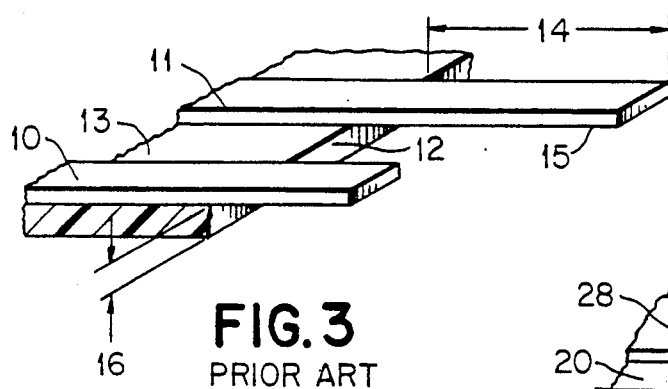
FIG. 3 is a schematic view of a prior art staggered row dielectric supported automated bondable conductor.

The advantages of the improved conductor attachment portion structures of the invention as illustrated in FIGS. 1 and 2 may be seen in comparison with a typical prior art schematic view as shown in FIG. 3. In FIG. 3, the art is now handling densities where the conductors 10 and 11 are of the order of 5 mils wide on 10 mil center to center adjacent spacing. The bonding locations, not shown, are staggered in more than one row so that alternate conductors, of which element 10 is one example, would contact locations in a near row, and of which element 11 is another example, would contact locations in a row farther separated from the support edge 12 of the dielectric 13. In the prior art structure of FIG. 3, the long unsupported distance 14 to the bonding location 15, is subject to making undesired electrical contact with adjacent conductors and pads, is subject to lateral movement that increases registration difficulty and being separated by the thickness 16 of the dielectric 13 interferes with precision in bonding. In contrast, with the improved conductor attachment portion structures of the invention as illustrated in FIGS. 1 and 2, the combined features of adjacent dielectric support to within a uniform distance 4 of the bonding location, and, the conductor end to be bonded positioned at a level 7 that coincides with the underside of the dielectric, all operate to avoid unwanted shorts to permit tighter spacing and to have uniform and minimum thermal excursion and dwell needed for reliable bonding.

Figure 4:
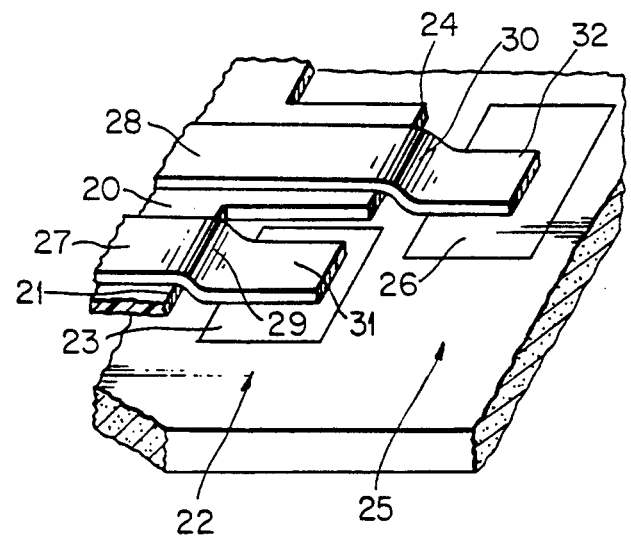
FIG. 4 is a schematic view of one embodiment of a staggered row automated bondable conductor attachment structure employing the attachment portions of FIG. 1 with a staggered edge dielectric opening.
Figure 5:
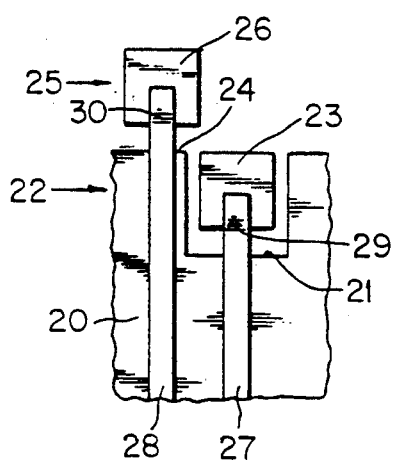
FIG. 5 is a schematic illustration of a top view of the embodiment of FIG. 4.

Referring to FIGS. 4 and 5, in accordance with the invention, a new type of automated bonding type lead frame structure is shown wherein the edge of the dielectric adjacent the rows of bonds is provided with extensions that support the conductor to the uniform dimension 4 of FIG. 1. This produces a new tape structure with edges that may be described as being castellated, crenellated or staggered. In FIG. 4, a portion of the staggered, castellated or crenellated edge dielectric 20 is shown with one edge 21 corresponding to one row 22, one bonding location or pad of which is shown as element 23 and with another edge 24 corresponding to a second row 25, one bond location or pad of which is shown as element 26. The dielectric 20 which is usually a portion of a lead frame conductor pattern bearing member such as a Tape Automated Bonding tape has conductors 27 and 28 each formed by bending at locations 29 and 30, respectively, to position attachment portions 31 and 32, respectively, at the same level as the underside of the dielectric 20 and at uniform distances from the respective edges 21 and 24. Thus, with the staggered edge dielectric automated bonding tape of the invention, the attachment portions of each conductor are supported a uniform distance from the dielectric regardless of what row they are in and all are at the same level which is in the plane of the underside of the dielectric.

In FIG. 5, a schematic top view is provided wherein the rows 22 and 25 of FIG. 4 have illustrative pads 23 and 26 labelled. The illustrative conductors 27 and 28 are each bent over its respective edges 21 and 24 of the dielectric 20 so that the attachment portions 31 and 32 are supported by the dielectric 20 an essentially uniform distance from the bond to the respective pads 23 and 26.

While the structure shown has two rows of pads, and these are usually at the edge of a contact area, it will be apparent in the light of the principles involved that for pad locations even farther away extensions of the dielectric can be provided to within a uniform attachment distance.

Figure 6:
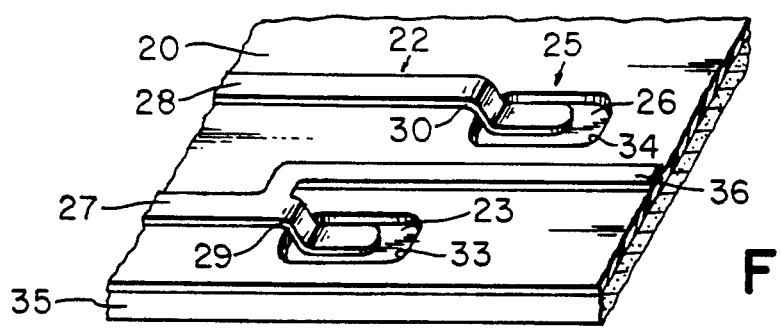
FIG. 6 is a schematic view of another embodiment of a staggered row automated bondable conductor attachment structure employing the attachment portions of FIG. 2 with a separate window in the dielectric for each conductor attachment.
Figure 7:
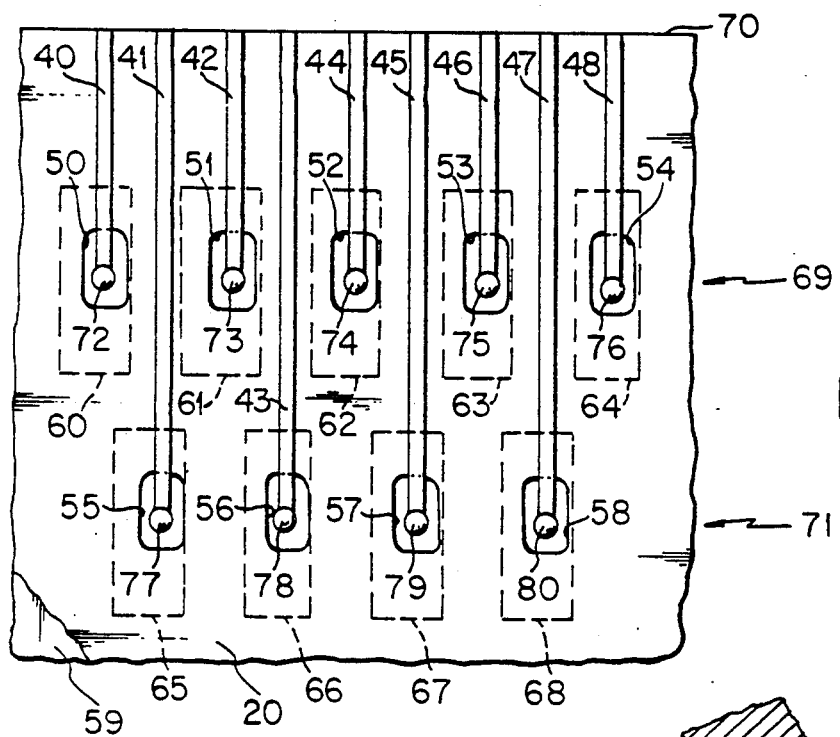
FIG. 7 is a schematic top view of close spacing of conductors and pads.
Figure 8:
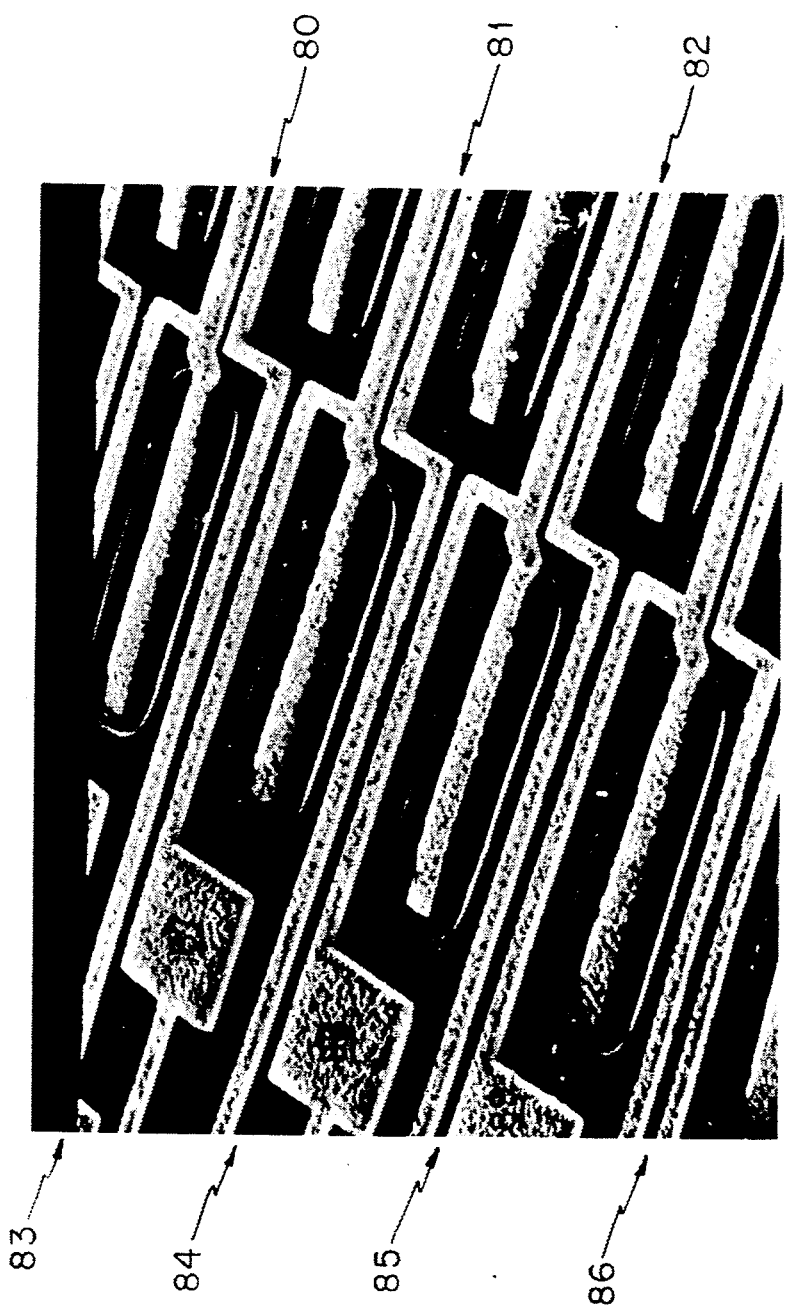
FIG. 8 is a photomicrograph of the window dielectric structure of FIG. 6 with the conductor attachment portions of FIG. 1.

Referring next to FIGS. 6, 7 and 8 wherein another type of tape automated bonding type lead frame is described. In the type of tape automated bonding lead frame of FIGS. 6, 7 and 8, the dielectric covers the attachment area with the attachment to the pads or other circuitry occurring in individual windows in the dielectric. This type of structure is very advantageous where there may be such situations as close conductor spacing, many attachment locations or pads with cumulative positioning tolerances and attachment locations or pads at extended distances from the edge of the chip or other circuitry.

In FIG. 6, in a schematic view, the dielectric 20 covers the entire surface of the attachment area which in the case of Tape Automated Bonding, the tape material itself would be the dielectric. The conductors, 27, to a row 22 near the edge of an attachment area, and 28, to a row 25 farther removed from the edge of an attachment area, are respectively bonded to the pads 23 and 26 on the chip or other circuitry 35, through windows 33 and 34, with the conductors 27 and 28 being formed by bending at locations 29 and 30 over the edge of the dielectric 20 at each respective window 33 and 34 thereby providing support to a uniform distance from the bond. The dielectric 20, in addition to lateral motion control of the conductors 27 and 28 insulates the conductors from the circuitry and connections on the element 35, as they cross to the particular attachment window and permits further conductor capability, such as is illustrated by element 36, to extend across the attachment area such as is illustrated by element 35. The additional conductor capability is very useful in chip and complex circuitry technologies where bonding locations are remote from the edges of the attachment area such as is occurring in some chip technology due to need for more contacts than can be positioned near the edges and post design engineering changes. In FIG. 7 a spacing illustration is provided in the form of a schematic top view of a closely positioned array of conductors 40–48 on a dielectric 20, each respectively bonded through windows 50–58 to pads 60–68 in the attachment area of a chip 59, the outline of the pads 60–68 being shown dotted through the dielectric 20. The pads 60 to 64 are in one row 69 near an edge 70 of the attachment area of the chip 59 and the pads 65 to 68 are in another row 71 more remote from the edge 70. The attachment bonds 72–80 are made using the ball element 8 of the FIG. 2 attachment end embodiment. In manufacturing, the pad sizes, lateral locations along the rows, and locations row to row, all have tolerances and similarly the conductors on the dielectric have tolerances in both width and positioning. Limits in reliable product manufacturability occur when the interrelationship of the tolerances produce unacceptable situations. In the illustration of FIG. 7, the conductor 41 going to a pad 65 in row 71 is too close to the outline of the pad 61 in row 69. In accordance with the invention, the dielectric 20 however insulates the conductors 40–48 vertically so that in passing over other contact locations the problems of cumulative tolerances producing undesirable conditions is relaxed.

In FIG. 8, in a photomicrograph, there are illustrations of conductor positioning precision at locations 80–86, bonding precision at each window and the ability to provide conductive members such as pads 87–89 on the dielectric.

In manufacturing, in order to assure the positioning of each conductor end either at or tangential to the same plane as the lower surface of the dielectric a forming operation is necessary that will bring the conductor from the upper surface of the dielectric to the desired position. In the case of a conductor attachment end, such as FIG. 1, a bending operation at location 6 is required, and, in the case of a conductor attachment end, such as FIG. 2, variations in size of ball 8 may result in attachment ends that are above the undersurface of the dielectric so that a bending operation of the conductor 1 to bring the ball 8 tangential to the line 7 of the undersurface of the dielectric is desirable.

While the bending operation can be accomplished by pressing in a die, as the contact density increases, it will be apparent that such a die would become an expensive item.

In accordance with the invention, apparatus is provided that will form tape automated bonding conductor attachment structures into the plane of the underside of the dielectric. The apparatus is illustrated in connection with FIGS. 9 to 12.

Figure 9:
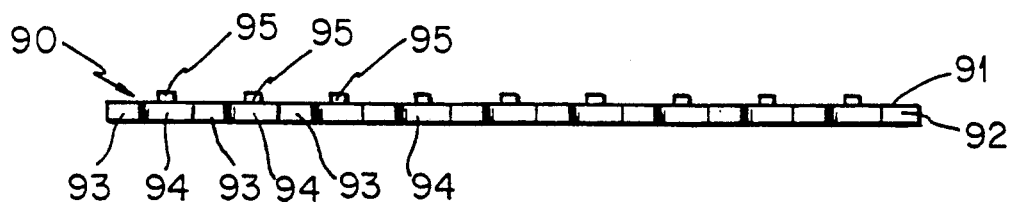
FIG. 9 is a front view of the relative conductor and staggered dielectric edge positioning of the structure of FIGS. 4 and 5.

Referring to FIG. 9, there is shown a schematic front view of the dielectric and conductors as in FIG. 4 along a row of contacting locations. All conductors 90 extend above the upper surface 91 of the dielectric 92. The elements 93 of which three are labelled between openings 94 of which three are labelled correspond to the edge 24 of FIG. 4. The conductors 95 of which three are labelled extend in a cantilever beyond the edge of the dielectric corresponding to edge 21 of FIG. 4. In order to have the conductors in the row at the level of the underside of the dielectric 93, the conductors 95 are bent over the edge of the dielectric 93 into the openings 94 to the plane of the underside of the dielectric 93.

In accordance with the invention, this is accomplished by passing the dielectric with the conductors between a pair of rollers, one of which is solid and establishes the level to be at the plane of the underside of the tape while the other is elastomeric accommodating the surface thereof to the presence of the conductors while forcing the cantilevered conductor ends to bend over the adjacent dielectric edges to the position level with the plane of the underside of the dielectric as established by the solid roller.

Figure 10:
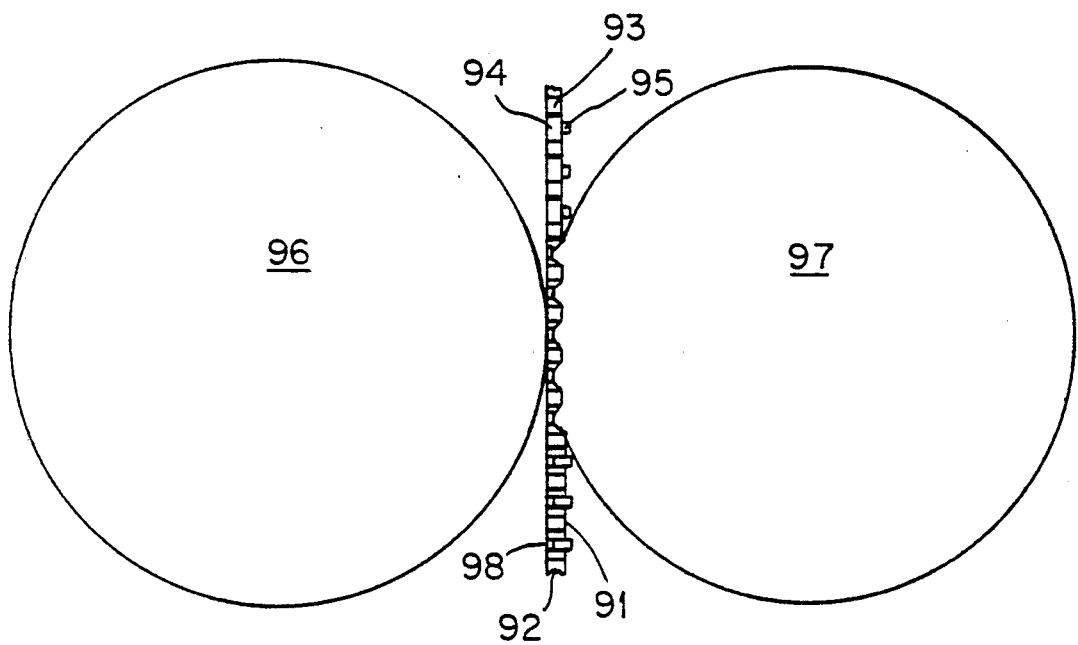
FIG. 10 is a schematic view of a rolling operation that positions the attachment portions of all conductors in line with the underside of the dielectric.

Referring to FIG. 10, the solid roller is labelled 96 and the elastomer roller is labelled 97. The dielectric 93 with the conductors 95 on the side of the elastomer roller passes between the rollers and forces the cantilevered conductors 95 into the openings 94 between the portions of the dielectric 93 into the position 98 even with the underside of the dielectric.

Figure 11:
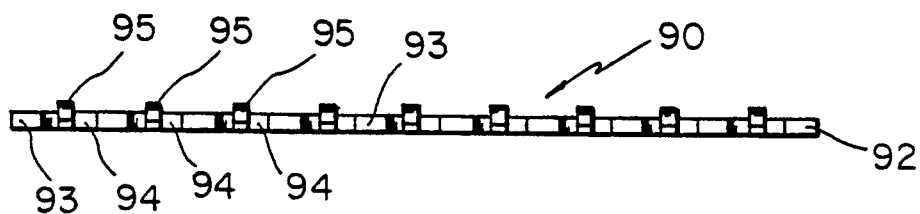
FIG. 11 is a front view of the relative conductor and dielectric edge positioning after forming into line with the underside of the dielectric by the rolling operation of FIG. 10.

In FIG. 11 there is shown a schematic front view of the structure of FIG. 9 after the rolling operation of FIG. 10. The cantilevered conductors 95 of which 3 are labelled, have been bent into the openings 94 of which 3 are labelled and are positioned at the level of the plane of the underside of the dielectric 92.

Figure 12:
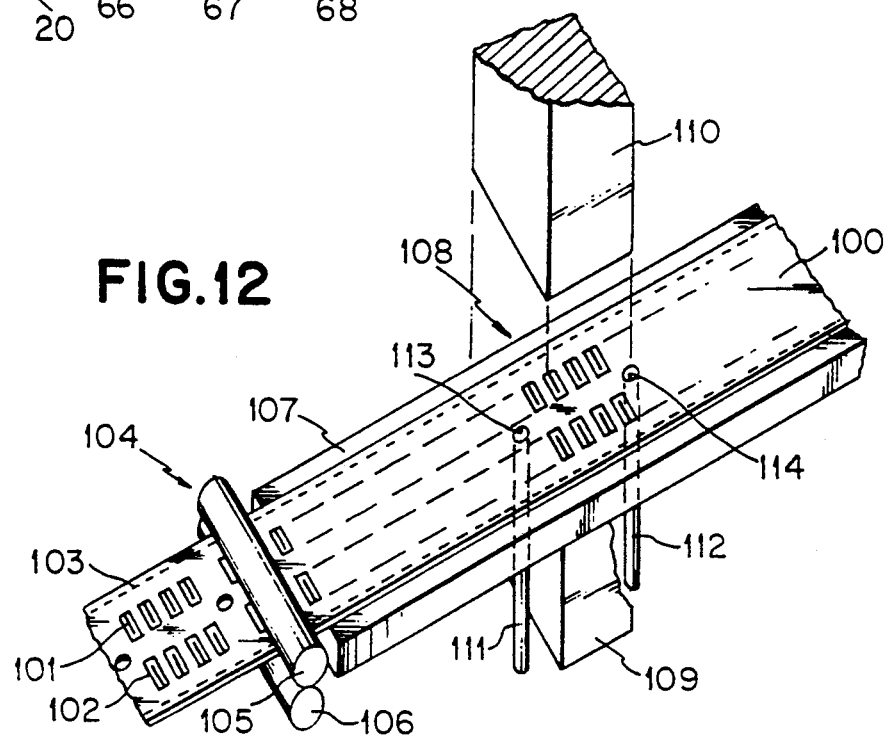
FIG. 12 is a schematic view of tape automated bonding apparatus having forming capability for positioning all attachment portions of the conductors at the level of the contact face of the dielectric.

In FIG. 12 there is shown a schematic view of the tape automated bonding apparatus of the invention with the forming capability. The TAB tape 100 with the conductor attachment ends 101 shown cantilevered into windows 102 is moved by sprocket drive shown as dashes 103 through a forming station 104 having an elastomer roller 105 pressing the tape 100 against a solid roller 106 which bends all contact attachment ends to the level of the underside of the dielectric of the TAB tape 100. The TAB tape 100 continues along a supporting bed 107 to a bonding station 108 at which the chip or other circuitry is located on a support 109 for bonding heat application through a thermode 110 that travels along the dashed line to simultaneously form all connecting bonds. Registration of the tape with the chip or other circuitry is accomplished through pins 111 and 112 that pass through holes 113 and 114 in the TAB tape 100. It will be apparent that many variations can be employed without departing from the principles of TAB tape bonding with all attachment ends at the level of the underside of the dielectric such as turret type support at 109 and row by row thermode step bonding.

BEST MODE OF CARRYING OUT THE INVENTION

The preferred embodiment of the invention is as shown in FIGS. 6 and 8 wherein the dielectric 20 is two mils thick polyimide, the conductors are 1.4 mils thick Cu plated with Au, with bonds being solder between 63 Sn 37 Pb to 97 Sn 3 Pb. The dimension 4 is in the vicinity of 4 mils. The elastomer roller is of the order of 250 mils diameter with a 10 mil deformable surface. The opposing roller is the same size but of stainless steel.

What has been described is a technology for multiple location conductor attachment to electronic substrates wherein the conductor end portion is attached a uniform distance from the supporting dielectric at the level of the underside of the dielectric and where the dielectric is arranged with staggered edges or windows at the connection locations and the conductor ends are rolled level with the underside of the dielectric.

Having thus described our invention, what we claim as new and desire to secure by Letters Patent is:

1. A structure comprising:
   a dielectric layer having an edge extending through said layer with separated protrusions, and
   a plurality of conducting leads on one face of said dielectric layer, each of said leads extending over each single separation and each protrusion.

2. The structure of claim 1 wherein each of said conducting leads on said dielectric layer that is extending over each said single separation and each said protrusion of said edge of said dielectric layer is bent to a position even with and parallel to the opposite face of said dielectric layer.

3. A structure comprising:
   a dielectric layer having first and second opposite faces and an edge
      said edge extending through said layer from said first to said second face
      said edge further having separated protrusions, and
   a plurality of conducting leads on said first face of said dielectric layer
      each of said leads extending cantilevered beyond said edge at each separation and each protrusion.

4. The structure of claim 3 wherein each of said conducting leads on said first face of said dielectric layer that is extending cantilevered beyond said edge is bent to a position even with and parallel to said second face of said dielectric layer.

5. The structure of claim 2 wherein each said lead is bent over said dielectric layer to a uniform distance from said dielectric layer.

6. The structure of claim 5 wherein said dielectric layer is 2.0 mils thick polyimide, said conducting leads are 1.4 mils thick Cu plated with Au, and said uniform distance is 4.0 mils.

7. The structure of claim 1 wherein each said lead has a ball contact at said end thereof, said ball contact being a uniform distance from said edge and extending to the plane of the opposite face of said dielectric layer.

8. The structure of claim 7 wherein said dielectric layer is 2.0 mils thick polyimide, said conducting leads are 1.4 mils thick Cu plated with Au, and said uniform distance is 4.0 mils.

9. A structure comprising:
   a dielectric layer area having a pattern of conducting leads thereon,
      said dielectric layer shape and said conducting lead pattern being so interrelated that each conducting lead in said pattern is supported by an edge portion of said dielectric to within an equal cantilever length of the end of said conducting lead and, adjacent conducting leads in said pattern terminate at different distances from the periphery of said area.

10. The structure of claim 9 wherein all cantilevered conducting leads extend into a common chip surface accommodating opening in said dielectric layer.

11. The structure of claim 9 wherein each cantilevered conducting lead extends into an individual contact opening in said dielectric layer.

12. A structure comprising:
   a conducting lead supporting dielectric layer having an area contiguous with the surface of a chip,
      said dielectric layer having at least one aperture therethrough exposing at least one chip contact bonding location,
      said dielectric layer having a pattern of conducting leads thereon,
      each said conductor in said pattern extending cantilevered into said at least one aperture a uniform distance beyond a supporting edge portion of said dielectric at each said at least one aperture, and,
      each adjacent conductor in said pattern terminating a different distance from the boundary of said dielectric layer area.

13. A structure comprising:
   a dielectric layer having first and second opposite faces and an edge;
      said edge extending through said layer from said first to said second face;
      said edge further having separated protrusions, and,
   at least one conducting lead on said first face of said dielectric layer extending onto at least one of said protrusions.

14. The structure of claim 13 wherein each said conducting lead on said first face of said dielectric layer extending onto a protrusion extends further cantilevered beyond said edge and is bent to a position even with and parallel to said second face of said dielectric layer.

15. The structure of claim 14 wherein said dielectric layer is 2.0 mils thick polyimide, said conducting leads are 1.4 mils thick Cu plated with Au, and said cantilevered portion of said conducting lead extends a distance of 4.0 mils.

16. The structure of claim 13 wherein each said conducting lead on said first face of said dielectric layer extending onto a protrusion extends further cantilevered beyond said edge and has a ball contact on the end thereof said ball contact extending to the plane of the second face of said dielectric layer.

17. The structure of claim 16 wherein said dielectric layer is 2.0 mils thick polyimide, said conducting leads are 1.4 mils thick Cu plated with Au, and said ball contact is a distance of 4.0 mils from said edge.

* * * * *